(12) United States Patent
Ando et al.

(10) Patent No.: US 7,274,071 B2
(45) Date of Patent: Sep. 25, 2007

(54) ELECTROSTATIC DAMAGE PROTECTION DEVICE WITH PROTECTION TRANSISTOR

(75) Inventors: Ryoichi Ando, Kumagaya (JP); Akira Uemoto, Gunma (JP); Toshio Kakiuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 5 days.

(21) Appl. No.: 10/979,804

(22) Filed: Nov. 3, 2004

(65) Prior Publication Data
US 2005/0121725 A1 Jun. 9, 2005

(30) Foreign Application Priority Data
Nov. 5, 2003 (JP) ............................. 2003-375383

(51) Int. Cl.
*H01L 23/62* (2006.01)
(52) U.S. Cl. .................. 257/355; 257/356; 257/360; 257/361; 257/362; 257/173; 257/174
(58) Field of Classification Search ................ 257/355, 257/356, 360, 361, 362, 367, 173, 174, 357, 257/358
See application file for complete search history.

(56) References Cited

U.S. PATENT DOCUMENTS

| 5,602,409 | A | * | 2/1997 | Olney | ........................ 257/362 |
| 5,675,168 | A | * | 10/1997 | Yamashita et al. | .......... 257/355 |
| 6,043,968 | A | | 3/2000 | Haruki | |
| 6,396,107 | B1 | | 5/2002 | Brennan et al. | |
| 6,404,269 | B1 | * | 6/2002 | Voldman | ..................... 327/534 |
| 6,963,111 | B2 | * | 11/2005 | Reddy et al. | ................ 257/356 |

FOREIGN PATENT DOCUMENTS

| JP | 5-267586 | | 10/1993 |
| KR | 1999-007170 | A | 1/1999 |
| KR | 2002-0052874 | A | 7/2002 |

* cited by examiner

*Primary Examiner*—Evan Pert
*Assistant Examiner*—Tan N. Tran
(74) *Attorney, Agent, or Firm*—Morrison & Foerster LLP

(57) ABSTRACT

This invention provides an electrostatic damage protection device which can protects a device to be protected enough from an electrostatic damage and prevents damages of protection transistors themselves. A N-channel type first MOS transistor and a N-channel type second MOS transistor serving as protection transistors are connected in series between an output terminal and a ground potential. On the other hand, a P-channel type third MOS transistor and a P-channel type fourth MOS transistor serving as protection transistors are connected in series between a high power supply potential and the output terminal. These first, second, third, and fourth MOS transistors are formed of low withstand voltage MOS transistors.

8 Claims, 6 Drawing Sheets

ELECTROSTATIC DAMAGE PROTECTION DEVICE WITH PROTECTION TRANSISTOR

CROSS-REFERENCE OF THE INVENTION

This invention is based on Japanese Patent Application No. 2003-375383, the content of which is incorporated by reference in its entirety.

BACKGROUND OF THE INVENTION

1. Field of the Invention

This invention relates to an electrostatic damage protection device, particularly to such a device provided for a terminal where a high voltage is inputted or outputted.

2. Description of the Related Art

A semiconductor integrated circuit such as a DC-DC converter and an LCD driver has a terminal where a higher voltage (e.g. 20V or more) than the normal power supply voltage (3V or 5V) is inputted or outputted, a transistor for inputting or outputting such a high voltage through the terminal, and also an electrostatic damage protection device for protecting such a transistor from an electrostatic damage.

FIG. 5 is a circuit diagram of an electrostatic damage protection device of the conventional art. A numeral 100 designates an output terminal, a numeral 110 designates an output MOS transistor having a high withstand voltage connected with this output terminal 100, a numeral D1 designates a first diode having a high withstand voltage where a cathode is connected with the output terminal 100 and an anode is connected with a ground potential Vss. A numeral D2 designates a second diode having a high withstand voltage where an anode is connected with the output terminal 100 and a cathode is connected with a high power supply potential HVdd (e.g. 20V). These first and second diodes D1 and D2 having a high withstand voltage form the electrostatic damage protection device. The reason for using the first and second diodes D1 and D2 having a high withstand voltage is to prevent a breakdown of the diodes caused by a high voltage applied to the output terminal 100 during the normal operation.

In this electrostatic damage protection device, when a surge voltage is applied from outside to the output terminal 100, either one of the first or second diode D1 or D2 turns on in a forward direction and another generates a breakdown in a reverse direction according to a polarity of the surge voltage, so that an electric charge generated by the surge voltage is led to a power supply line or a ground line, thereby preventing the output transistor 110 from being applied with the high voltage and damaged.

FIG. 6 is a circuit diagram of other electrostatic damage protection device of the conventional art. It is noted that the same numerals are provided to the same components as those in FIG. 5. This electrostatic damage protection device has a first MOS transistor having a high withstand voltage of an N-channel type Tr1 where a drain is connected with an output terminal 100 and a source and a gate are connected with a ground potential Vss, and a second MOS transistor having a high withstand voltage of a P-channel type Tr2 where a drain is connected with the output terminal 100 and a source and a gate are connected with a high power supply potential HVdd. The reason for using the first and second transistors Tr1 and Tr2 having a high withstand voltage is to prevent a breakdown of the transistors caused by a high voltage applied to the output terminal 100 during the normal operation.

In this electrostatic damage protection device, when a surge voltage is applied from outside to the output terminal 100, either one of the first and second MOS transistor Tr1 or Tr2 turns on and another generates a breakdown between the source and the drain according to a polarity of the surge voltage, so that an electric charge generated by the surge voltage is led to a power supply line or a ground line, thereby preventing the output MOS transistor 110 from being applied with the high voltage and damaged.

However, in the electrostatic damage protection device shown in FIG. 5, resistance of the first and second diode D1 and D2 are large, thereby providing a difficulty in leading the electric charge generated by the surge voltage to the power supply line and so on. This causes such problems that this electrostatic damage protection device can not protect the output MOS transistor enough and the first and second diode D1 and D2 themselves are easily damaged.

Furthermore, in the electrostatic damage protection device shown in FIG. 6, the resistance of the source and the drain of the first and second MOS transistors Tr1 and Tr2 are large, so that there arises such a problem that the damage can easily occur in the first and second MOS transistors Tr1 and Tr2, particularly in surface portions of the drains of these transistors.

Furthermore, in the electrostatic damage protection device shown in FIGS. 5 and 6, although electrostatic damage protection characteristics can be improved by designing the large-sized first and second diodes D1 and D2 and the large-sized first and second MOS transistors Tr1 and Tr2 to reduce resistance thereof, this causes a problem of increasing a chip area in the semiconductor integrated circuit.

SUMMARY OF THE INVENTION

In an electrostatic damage protection device of the invention, a plurality of protection transistors are connected in series between a terminal connected with a device to be protected and a predetermined potential, and a substrate of the protection transistor is connected with a connection point of the protection transistor and the adjacent protection transistor. The protection transistors are formed by using a triple well structure so as to realize such a connection relationship of the protection transistors on a semiconductor integrated circuit.

Since the electrostatic damage protection device of the invention is formed by connecting the plurality of the protection transistors in series, a voltage applied to one of the transistors can be reduced. Furthermore, the substrate of the protection transistor is connected with the connection point of this protection transistor and the adjacent transistor, so that it is prevented that a high voltage is applied between the substrate and the drain or the source of the protection transistor.

Therefore, transistors giving a low withstand voltage can be used as the protection transistors instead of devices having a high withstand voltage such as the first and second transistors Tr1 and Tr2 of the conventional art. Thus, the protection transistor having a low withstand voltage has smaller resistance due to its structure than the protection transistor having a high withstand voltage so that an electric charge generated by the surge voltage can be easily led to the power supply line and so on.

Accordingly, the electrostatic damage protection device of the invention can protect an output MOS transistor enough, and damages of the protection transistors themselves can be prevented.

In the electrostatic damage protection device of the invention, a device to be protected can be protected enough from an electrostatic damage, and damages of protection transistors themselves can be prevented. Furthermore, size of the protection transistors can be reduced, so that size of a semiconductor integrated circuit can be also reduced.

DETAILED DESCRIPTION OF THE INVENTION

Figure 1:
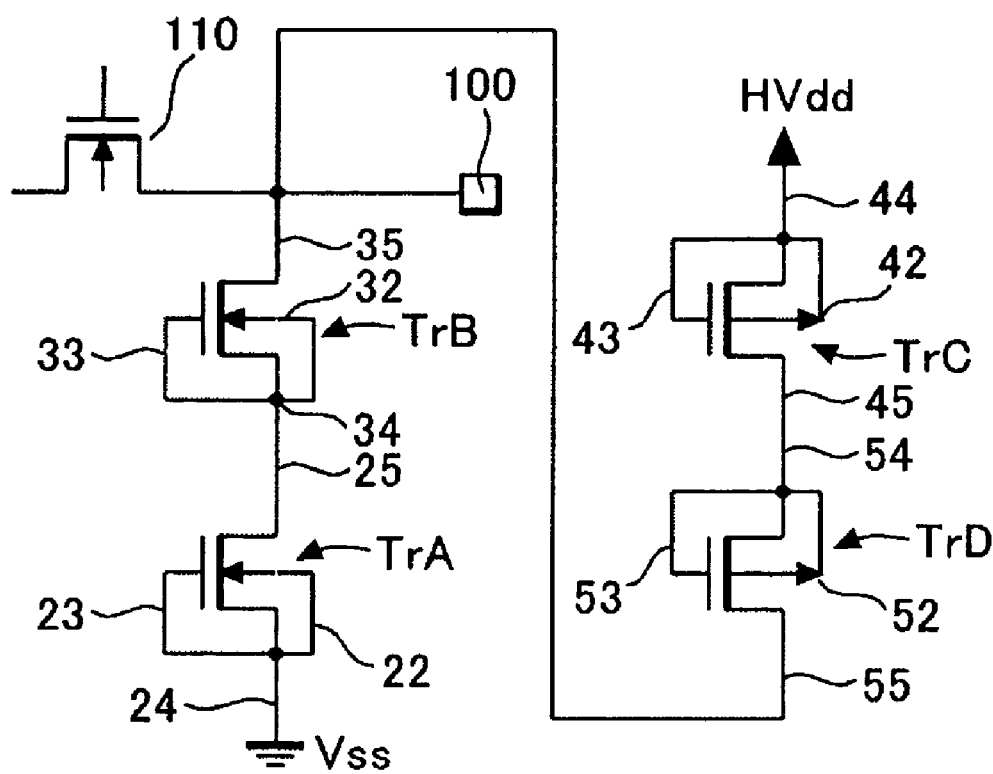
FIG. 1 is a circuit diagram of an electrostatic damage protection device of an embodiment of the invention.
Figure 2A:
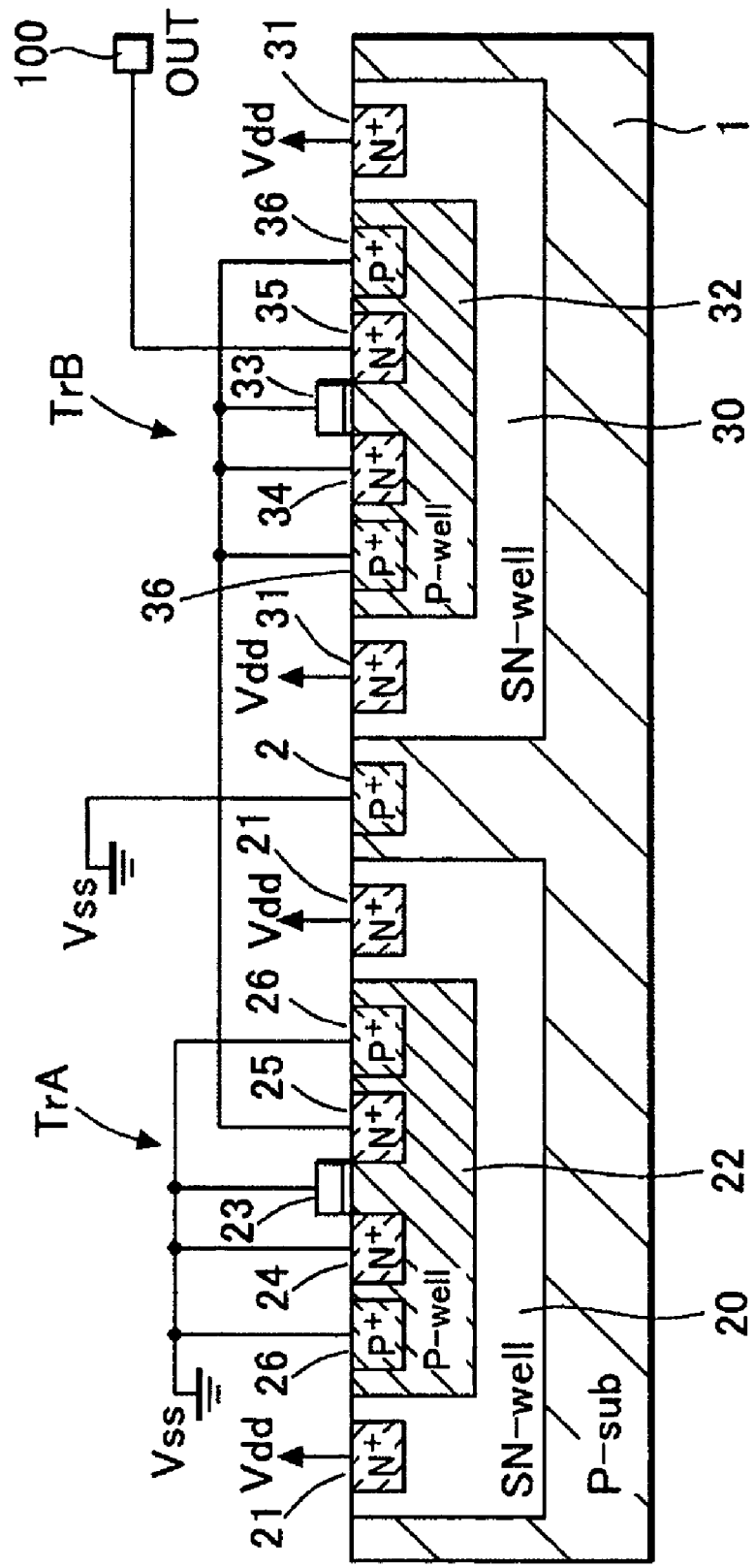
FIG. 2A is a cross-sectional view of a first MOS transistor TrA and a second MOS transistor TrB forming the electrostatic damage protection device of the embodiment.
Figure 2B:
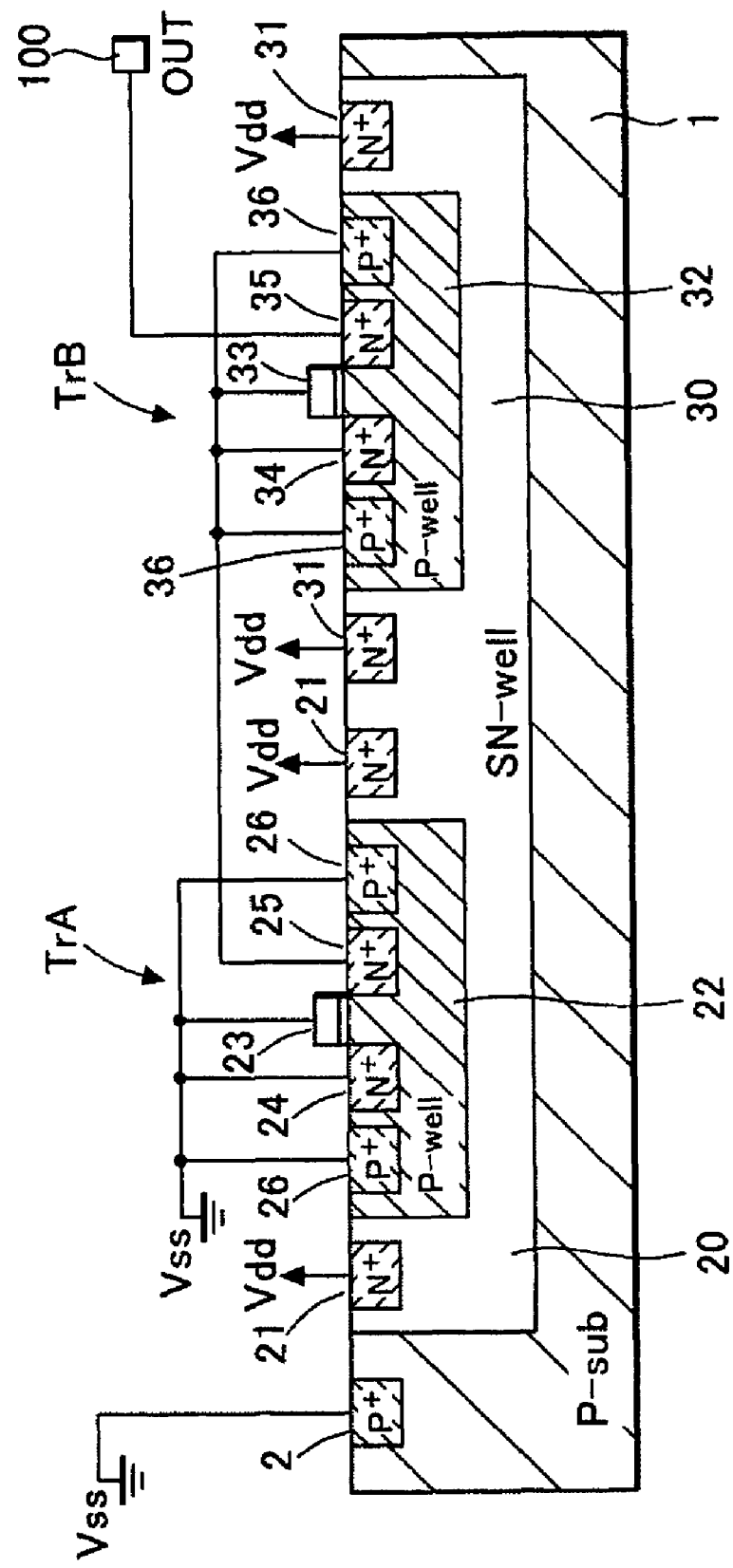
FIG. 2B is a cross-sectional view of the device of FIG. 2A modified so that the two transistors TrA and TrB are formed in one well.
Figure 3:
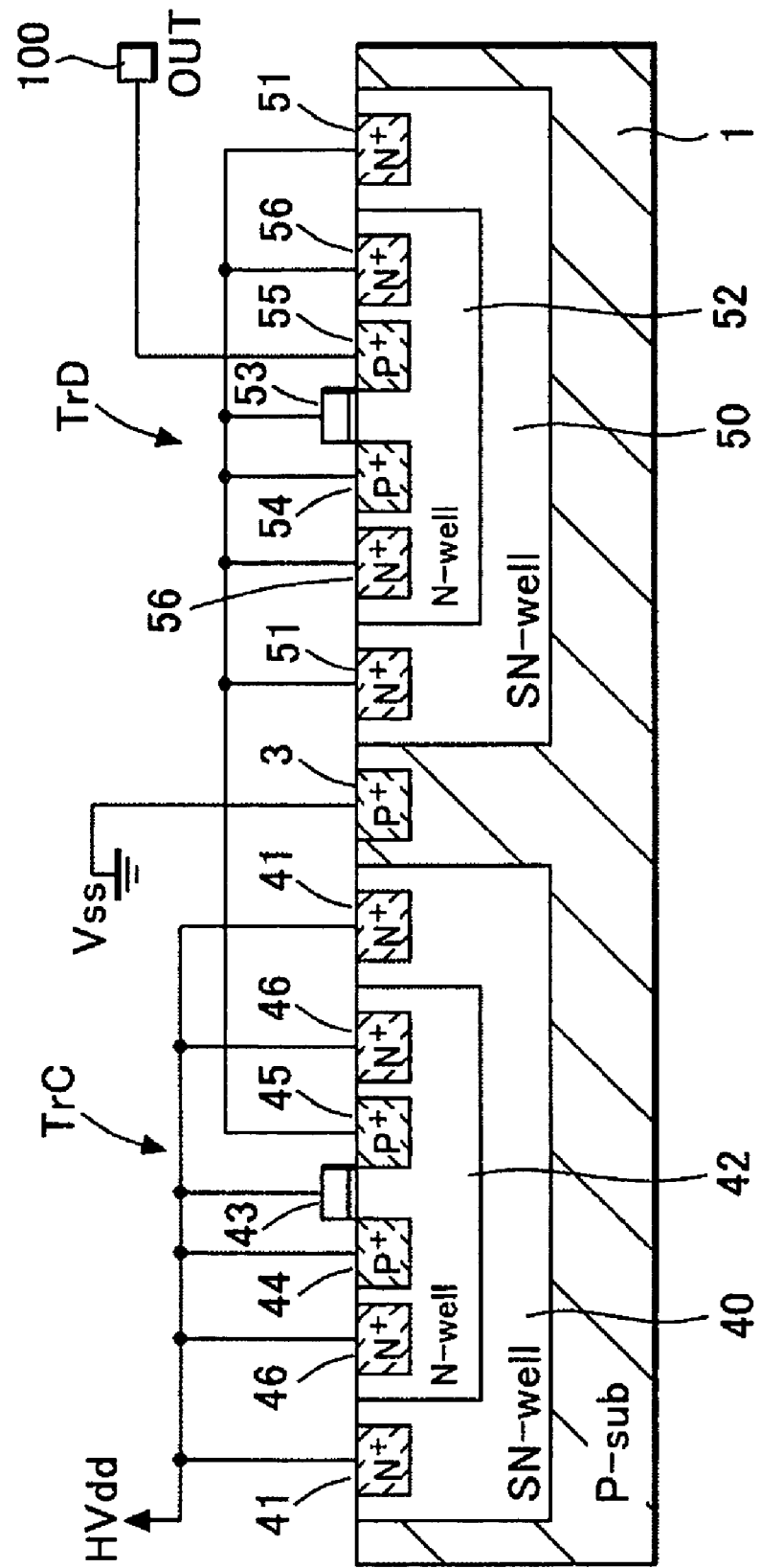
FIG. 3 is a cross-sectional view of a third MOS transistor TrC and a fourth MOS transistor TrD forming the electrostatic damage protection device of the embodiment.

Next, an electrostatic damage protection device of an embodiment of the invention will be described with reference to drawings. FIG. 1 is a circuit diagram of the electrostatic damage protection device. FIGS. 2A and 2B are a cross-sectional views of a first MOS transistor TrA and a second MOS transistor TrB forming this electrostatic damage protection device. FIG. 3 is a cross-sectional view of a third MOS transistor TrC and a fourth MOS transistor TrD forming the electrostatic damage protection device.

As shown in FIG. 1, a numeral 100 designates an output terminal, a numeral 110 designates an output MOS transistor having a high withstand voltage connected with this output terminal 100. The N-channel type first MOS transistor TrA and second MOS transistor TrB serving as protection transistors are connected in series between the output terminal 100 and a ground potential Vss.

In detail, a gate 23 and a source 24 of the first MOS transistor, and a P-well 22 as a substrate of this transistor are connected with the ground potential Vss. A gate 33 and a source 34 of the second MOS transistor TrB, and a P-well 32 as a substrate of this transistor are connected with a drain 25 of the first MOS transistor TrA. A drain 35 of the second MOS transistor TrB is connected with the output terminal 100.

On the other hand, the P-channel type third MOS transistor TrC and fourth MOS transistor TrD serving as protection transistors are connected in series between the high power supply potential HVdd and the output terminal 100. In detail, a gate 43 and a source 44 of the third MOS transistor TrC, and a first N-well 42 as a substrate of this transistor are connected with the high power supply potential HVdd. A gate 53 and a source 54 of a fourth MOS transistor TrD, and a first N-well 52 as a substrate of this transistor are connected with a drain 45 of the third transistor TrC. A drain 55 of the fourth MOS transistor TrD is connected with the output terminal 100.

Accordingly, in this embodiment, since the electrostatic damage protection device is formed by connecting the first MOS transistor TrA and the second MOS transistor TrB in series, a voltage applied to one of the MOS transistors when a high potential (e.g. high power supply potential HVdd) is applied to the output terminal 100 in the normal operation can be reduced. By forming the first MOS transistor TrA and the second MOS transistor TrB in the same size, the voltage applied between the source and the drain of the first MOS transistor TrA and the second MOS transistor TrB becomes half of the whole voltage applied.

Furthermore, since the P-well 32 serving as the substrate of the second MOS transistor TrB is connected with a connection point between the first MOS transistor TrA and the second MOS transistor TrB, it is prevented that a high voltage is applied between the P-well 32 as the substrate and the drain 25. That is, a potential of the P-well 32 as the substrate rises more than the ground potential Vss so that a potential difference between the P-well 32 and the drain 25 becomes small.

Therefore, the first MOS transistor TrA and the second MOS transistor TrB can be formed of transistors having a low withstand voltage instead of transistors having a high withstand voltage. Generally, the transistor having a low withstand voltage has a smaller resistance due to its structure than the transistor having a high withstand voltage so that an electric charge generated by the surge voltage can be easily led to the power supply line and so on. Accordingly, this electrostatic damage protection device can protect the output MOS transistors enough and prevent damages of the protection transistors themselves. Although the above description is about the electrostatic damage protection device formed of the first MOS transistor TrA and the second MOS transistor TrB provided on the side of the ground potential Vss, the same effect can be obtained in the electrostatic damage protection device formed of the third MOS transistor TrC and the fourth MOS transistor TrD provided on the side of the high power supply potential HVdd.

Next, a structure and a connection relationship of these first MOS transistor TrA and the second MOS transistor TrB will be described in detail with reference to FIG. 2A. Two second N-wells 20 and 30 are formed on a surface of a P-type semiconductor substrate 1, being separated from each other. A P+ layer 2 is formed in the surface of the semiconductor substrate 1 in a region between the N-well 20 and 30, and the ground potential Vss is applied to this P+ layer 2.

These second N-wells 20 and 30 are formed in the same ion injection step and diffusion step. A P-well 22 shallower than the second N-well 20 is formed in a surface of the second N-well 20, and another P-well 32 shallower than the second N-well 30 is formed in a surface of the second N-well 30. These P-wells 22 and 32 are formed in the same ion injection step and diffusion step, which are different from the steps where the second N-wells 20 and 30 are formed.

A N+ layer 21 is formed near the P-well 22 in the surface of the second N-well 20. This N+ layer 21 is applied with the power supply potential Vdd, so that the second N-well 20 is biased from the power supply potential Vdd. Furthermore, a N+ layer 31 is formed near the P-well 32 in the surface of the second N-well 30. The N+ layer 31 is applied with the power supply potential Vdd so that the second N-well is biased from the power supply potential Vdd, similarly. It is noted that the power supply potential Vdd is smaller than the high power supply potential HVdd, but the high power supply potential HVdd can be used instead of the power supply potential Vdd.

The first MOS transistor TrA is formed in the P-well 22, and the second MOS transistor TrB is formed in another P-well 32. The first MOS transistor TrA has the gate 23 formed on the P-well 22 with the gate insulating film interposed therebetween, and the N+ source 24 and drain 25 formed in the P-well 22. A P+ layer 26 formed near the first MOS transistor TrA in the P-well 22 is applied with the ground potential Vss. The gate 23 and the source 24 are also applied with the ground potential Vss.

The second MOS transistor TrB has the gate 33 formed on the P-well 32 with the gate insulating film interposed therebetween, and the N+ source 34 and drain 35 formed in the P-well 32. The P+ layer 36 formed near the second MOS transistor TrB in the P-well 32, and the gate 33 and the source 34 are connected with the drain 25 of the first MOS transistor TrA. Accordingly, the P-well 32 as the substrate of the second MOS transistor TrB is set at the same potential as that of the drain 25 of the first MOS transistor TrA. Furthermore, the drain 35 of the second MOS transistor TrB is connected with the output terminal 100.

Accordingly, in this embodiment, by using a triple well structure, the first MOS transistor TrA and the second MOS transistor TrB are respectively formed in the P-wells 22 and 32 electrically separated from the semiconductor substrate 1. This can set the potential of the P-well 32 as the substrate of the second MOS transistor TrB at the potential of the drain 25 of the first MOS transistor TrB instead of the ground potential Vss of the semiconductor substrate 1. Furthermore, the second wells 20 and 30 are separated from each other so that the first MOS transistor TrA and the second MOS transistor TrB are formed in the second wells 20 and 30 which are electrically independent of each other, thereby being prevented from making an effect of outside noises on each other.

As a modification to the transistor structure shown in FIG. 2A, the first MOS transistor TrA and the second MOS transistor TrB may be formed in one N-well 30, as shown in FIG. 2B.

Next, a structure and a connection relationship of the third MOS transistor TrC and the fourth MOS transistor TrD will be described in detail with reference to FIG. 3. Two second N-wells 40 and 50 are formed on the surface of the P-type semiconductor substrate 1, being separated from each other. A P+ layer 3 is formed in the surface of the semiconductor substrate 1 in a region between the N-wells 40 and 50, and the ground potential Vss is applied to this P+ layer 3.

These second N-wells 40 and 50 are formed in the same ion injection step and diffusion step where the second N-wells 20 and 30 are formed. A first N-well 42 shallower than the second N-well 40 is formed in a surface of the second N-well 40, and another first N-well 52 shallower than the second N-well 50 is formed in a surface of the second N-well 50. These first N-wells 42 and 52 are formed in the same ion injection step and diffusion step.

A N+ layer 41 is formed near the first N-well 42 in the surface of the second N-well 40. This N+ layer 41 is applied with the high power supply potential HVdd so that the second N-well 40 and the first N-well 42 are biased from the high power supply potential HVdd. Furthermore, a N+ layer 51 is formed near the first N-well 52 in the surface of the second N-well 50. The N+ layer 51 is applied with the high power supply potential HVdd so that the second N-well 50 and the first N-well 52 are biased from the high power supply potential HVdd, similarly.

The third MOS transistor TrC is formed in the first N-well 42, and the fourth MOS transistor TrD is formed in another first N-well 52. The third MOS transistor TrC has the gate 43 formed on the first N-well 42 with the gate insulating film interposed therebetween, and the P+ source 44 and drain 45 formed in the first N-well 42. A N+ layer 46 formed near the third MOS transistor TrC in the first N-well 42 is applied with the high power supply potential HVdd. The gate 43 and the source 44 are also applied with the high power supply potential HVdd.

The fourth MOS transistor TrD has the gate 53 formed on the first N-well 52 with the gate insulating film interposed therebetween, and the P+ source 54 and drain 55 formed in the first N-well 52. The N+ layer 56 formed near the fourth MOS transistor TrD in the first N-well 52, and the gate 53 and the source 54 are connected with the drain 45 of the third MOS transistor TrC. Accordingly, the first N-well 52 as the substrate of the fourth MOS transistor TrD is set at the same potential as that of the drain 45 of the third MOS transistor TrC. Furthermore, the drain 55 of the fourth MOS transistor TrD is connected with the output terminal 100.

Accordingly, the third MOS transistor TrC and the fourth MOS transistor TrD are formed in the first N-wells 42 and 52 electrically separated from the semiconductor substrate 1. This can set the potential of the first N-well 52 at the potential of the drain 45 of the third MOS transistor TrC. Furthermore, the second wells 40 and 50 are separated from each other, so that the third MOS transistor TrC and the fourth MOS transistor TrD are formed in the second wells 40 and 50 which are electrically independent of each other, thereby being prevented from making an effect of outside noises on each other.

It is noted that the third MOS transistor TrC and the fourth MOS transistor TrD are formed in double N-wells, but can be formed in a single N-well by omitting one of the N-wells, instead.

Next, structures as the protection transistor of the first, second, third, and fourth MOS transistors TrA, TrB, TrC, and TrD will be described. As described above, in the electrostatic damage protection device of this embodiment, the two protection transistors are connected in series. Therefore, even if the protection transistors are MOS transistors having a low withstand voltage, the transistors can withstand the high voltage applied to the output terminal 100 during the normal operation. Furthermore, when the surge voltage is applied to the output terminal 100 and the protection transistors work as the electrostatic damage protection device, since the MOS transistors having a low withstand voltage have low resistance, the electric charge generated by the surge voltage can be led to the power supply line and the ground line quickly.

It is preferable that such a low withstand voltage MOS transistor has a source and drain structure of high impurity concentration as shown in FIGS. 2 and 3 for reducing the resistance. For example, the first MOS transistor TrA has the N+ source 24 and the N+ drain 25, and does not have the source and drain of low impurity concentration for the high withstand voltage MOS transistor. The second MOS transistor TrB, the third MOS transistor TrC, and the fourth MOS transistor TrD have the same structure as the first MOS transistor TrA.

However, the electrostatic damage protection characteristics can be improved even by using a MOS transistor having a DDD (double diffused drain structure) structure used for a miniaturization process or a LDD (lightly doped drain structure) structure, instead of using such a drain and source structure.

Figure 4A:
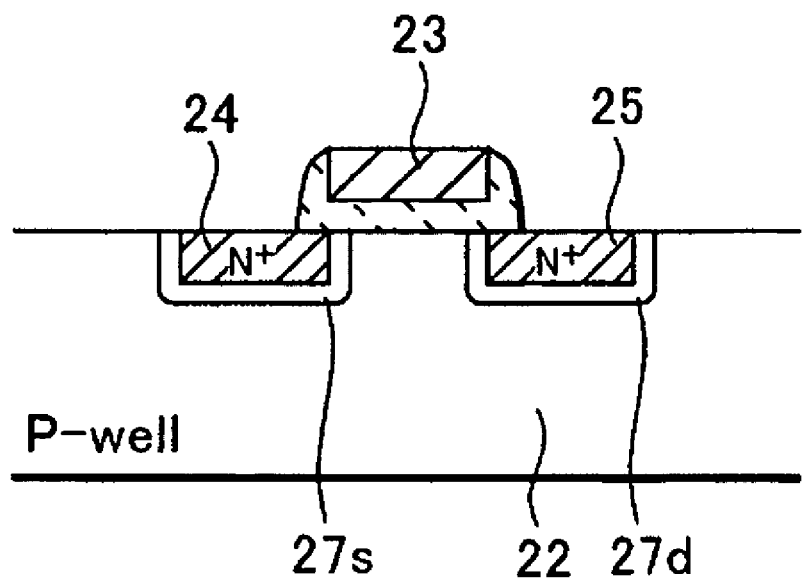
FIGS. 4A and 4B are cross-sectional views showing a structure of a protection transistor forming the electrostatic damage protection device of the embodiment.
Figure 4B:
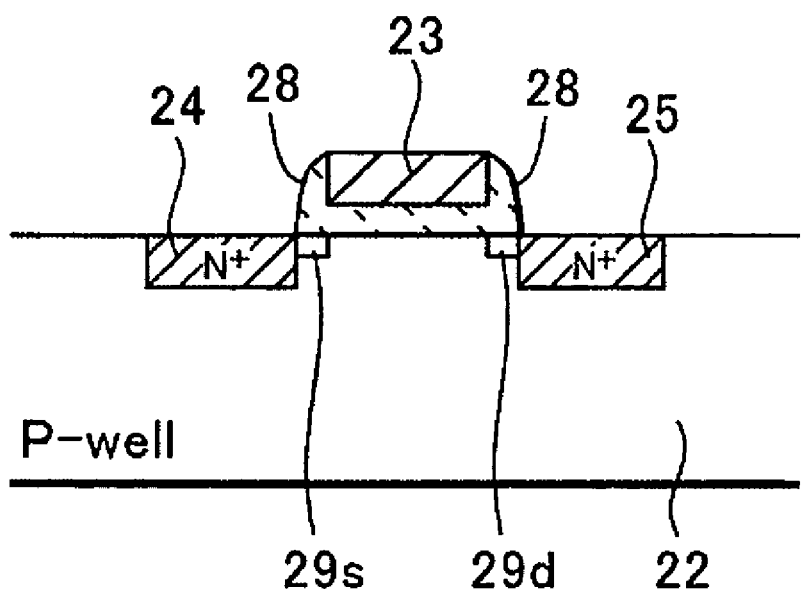
Figure 5:
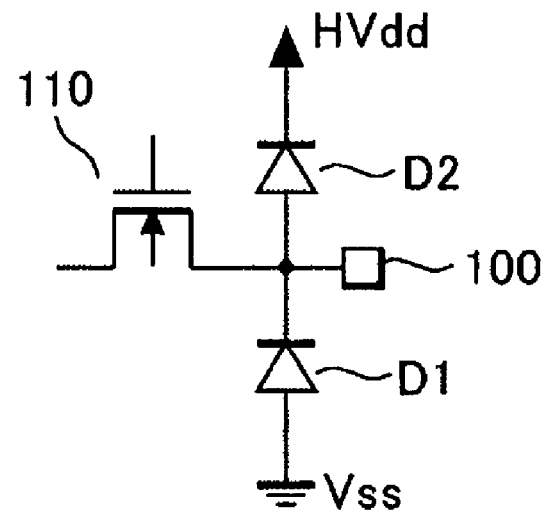
FIG. 5 is a circuit diagram of an electrostatic damage protection device of a conventional art.
Figure 6:
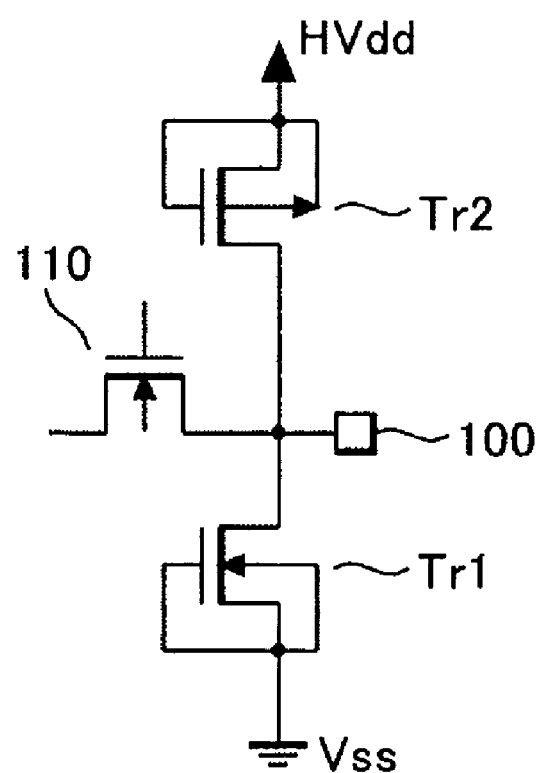
FIG. 6 is a circuit diagram of another electrostatic damage protection device of the conventional art.

FIGS. 4A and 4B are cross-sectional views showing a structure of the protection transistor. FIG. 4A shows a MOS transistor having the DDD structure, and FIG. 4B shows a MOS transistor having the LDD structure. The MOS transistor having the DDD structure shown in FIG. 4A has the N+ source 24 and the drain 25 of high impurity concentration, a N− source 27s of low impurity concentration which is diffused more deeper than the N+ source 24 and includes the N+ source 24 partially or wholly, and the N− drain 27d of low impurity concentration which is diffused deeper than the N+ drain 25 and includes the N+ drain 25 partially or wholly. These N− source 27s and the N− drain 27d are provided for preventing a short channel effect or a hot electron effect when the size of the transistor is reduced, but not for a high withstand voltage of the MOS transistor. Providing the N− source 27s and the N− drain 27d provides merely a bit of increase in resistance.

Therefore, the voltage which the source and drain can resist is about 6V to 7V at most even depending on a miniaturization amount, and this is largely lower than the voltage which the source and drain of the output MOS transistor 110 can resist (e.g. 20V or more). In the source and drain structure of the output MOS transistor 110, the N− source and drain are large-sized, so that the resistance is large.

Furthermore, the MOS transistor having the LDD structure shown in FIG. 4B has the N+ source 24 and drain 25, and a N− source 29s and a N− drain 29d of low impurity concentration in the surface of the P-well 22 under a sidewall spacer insulating film 28 formed on a sidewall of the gate 23. These N− source 29s and the N− drain 29d are provided for preventing a short channel effect or a hot electron effect when the transistor is miniaturized, too, but not for a high withstand voltage of the MOS transistor. Providing the N− source 29s and the N− drain 27d provides merely a bit of increase in resistance.

Although particular preferred embodiment of the invention has been disclosed in detail, it will be recognized that variations or modifications of the disclosed device are possible based on the disclosure for those skilled in the art and thus lie within the scope of the invention.

For example, in this embodiment, the first MOS transistor TrA and the second MOS transistor TrB are connected in series on the side of the ground potential Vss, and the third MOS transistor TrC and the fourth MOS transistor TrD are connected in series on the side of the high power supply potential HVdd, thereby forming the electrostatic damage protection device. However, the number of the transistors connected in series can be increased to three or more. In this case, a connection pattern of the transistors is the same as that of this embodiment. That is, each of the transistors is commonly connected with the gate and the source, and the substrate of the transistor is connected with the drain of the adjacent transistor to be connected with this transistor.

Although the description is made on the electrostatic damage protection device provided for a high withstand voltage output terminal where the output terminal 100 is connected with the output MOS transistor having a high withstand voltage in this embodiment, the invention is not limited to this and the electrostatic damage protection device can be provided for the high withstand voltage input terminal connected with the input MOS transistor having a high withstand voltage.

What is claimed is:

1. An electrostatic damage protection device connected between a power supply potential and a ground potential, comprising:
   a terminal connected with a transistor to be protected; and
   a first protection transistor and a second protection transistor that are connected in series between the terminal and the power supply potential,
   wherein a portion of a substrate on which the first protection transistor is formed is configured to be at a same electric potential as a connection point of the first protection transistor and the second protection transistor, and
   the transistor to be protected has a withstand voltage higher than withstand voltages of the first and second protection transistors.

2. An electrostatic damage protection device comprising:
   a semiconductor substrate of a first conductivity type;
   a terminal formed on the semiconductor substrate;
   a first well of a second conductivity type formed in a surface of the semiconductor substrate;
   a second well of the first conductivity type and a third well of the first conductivity type that are formed in the first well and are separated from each other; and
   a first protection transistor formed in the second well and a second protection transistor formed in the third well, the first protection transistor and the second protection transistor being connected in series between the terminal and a predetermined potential,
   wherein the first well is configured to receive a predetermined potential that is not supplied to the first and second protection transistors.

3. An electrostatic damage protection device comprising:
   a semiconductor substrate of a first conductivity type;
   a terminal formed on the semiconductor substrate;
   a first well of a second conductivity type and a second well of the second conductivity type that are formed in a surface of the semiconductor substrate and separated from each other;
   a third well of the first conductivity type formed in the first well;
   a fourth well of the first conductivity type formed in the second well;
   a first protection transistor formed in the third well; and
   a second protection transistor formed in the fourth well, the first protection transistor and the second protection transistor being connected in series between the terminal and a predetermined potential,
   wherein the first and second wells are configured to receive a predetermined potential that is not supplied to the first and second protection transistors.

4. An electrostatic damage protection device connected between a power supply potential and a ground potential, comprising:
   a semiconductor substrate of a first conductivity type;
   a terminal formed on the semiconductor substrate and connected with a device to be protected;
   a first well of a second conductivity type and a second well of the second conductivity type that are formed in a surface of the semiconductor substrate and separated from each other;
   a first protection transistor formed in the first well and a second protection transistor formed in the second well that are connected in series between the terminal and the power supply potential; and
   an impurity region of the first conductivity type formed in the semiconductor substrate between the first and second wells of the second conductivity type and connected with the ground potential.

5. The electrostatic damage protection device of claim 1, 2, 3 or 4, wherein each of the first and second protection transistors comprises a low withstand voltage MOS transistor.

6. The electrostatic damage protection device of claim 5, wherein a source and a drain of each of the first and second protection transistors comprises a diffusion layer of a high concentration.

7. The electrostatic damage protection device of claim 5, wherein a source and a drain of the low withstand voltage MOS transistor are formed of a diffusion layer of a high concentration and a diffusion layer of a low concentration.

8. The electrostatic damage protection device of claim 1, 2, 3 or 4, wherein a drain of the first protection transistor is connected to a source and a gate of the second protection transistor.

* * * * *